United States Patent [19]
George

[11] Patent Number: 5,814,953
[45] Date of Patent: Sep. 29, 1998

[54] POWER AMPLIFIER PREDRIVER STAGE

[75] Inventor: John Barrett George, Carmel, Ind.

[73] Assignee: Thomson Consumer Electronics, Inc., Indianapolis, Ind.

[21] Appl. No.: 574,023

[22] Filed: Dec. 18, 1995

[51] Int. Cl.⁶ .............................. H01J 29/70; H01J 29/76
[52] U.S. Cl. ...................... 315/397; 330/266; 330/207 P
[58] Field of Search .................................. 315/396, 397; 330/265, 266, 267, 207 P

[56] References Cited

U.S. PATENT DOCUMENTS

| | | |
|---|---|---|
| 2,863,008 | 12/1958 | Keonjian . |
| 4,166,983 | 9/1979 | Lacroix . |
| 4,483,016 | 11/1984 | Hochstein et al. ...................... 381/120 |
| 4,644,288 | 2/1987 | Stanley . |
| 4,719,393 | 1/1988 | McCanney ............................... 315/397 |
| 5,621,357 | 4/1997 | Botti et al. ............................... 330/253 |

OTHER PUBLICATIONS

John Barrett George, patent application Serial No. 08/563,528, filed on Nov. 28, 1995, and entitled Low–Power Transconductance Driver Amplifier.

*Primary Examiner*—Theodore M. Blum
*Attorney, Agent, or Firm*—Joseph S. Tripoli; Joseph J. Laks; Marion P. Metelski

[57] ABSTRACT

A power amplifier circuit drives a load with a convergence correction current which is proportional to a convergence correction voltage waveform that is applied to the power amplifier circuit. A predriver stage of the power amplifier circuit comprises first and second transistors in a push-pull configuration. First and second voltage divider networks bias emitter electrodes of the first and second transistors, respectively, so that a common-mode current flow between the first and second transistors is limited. The first and second voltage dividers also protect the first and second transistors, respectively, from damage caused by thermal runaway.

14 Claims, 2 Drawing Sheets

POWER AMPLIFIER PREDRIVER STAGE

BACKGROUND OF THE INVENTION

1. Field of the Invention

This invention relates generally to the field of amplifier circuits, and, in particular, to predriver stages for driving output stages in power amplifiers that drive deflection coils in, for example, convergence yokes of cathode ray tubes.

2. Description of Prior Art

Cathode ray tubes (CRTs) used in television receivers are subject to distortions of the video image on the CRT's faceplate raster. These distortions may include pincushion distortion, barrel distortion, trapezoidal distortion, horizontal non-linearity and vertical non-linearity.

A projection television receiver comprises three CRTs, which may be positioned in an off-axis orientation with respect to one another, and two of the three CRTs may be positioned in an off-axis orientation with respect to a projection screen. This alignment of the CRTs with respect to each other and with respect to the projection screen exacerbates those distortions of the video image already present at the CRT's faceplate raster. In addition, this alignment also introduces further distortions of its own into the video image on the projection screen, including horizontal and vertical trapezoidal distortion, skew distortion and bow distortion. The distortions present for each of the three colors are different because the orientation of each CRT with respect to the projection screen is different.

In order to correct these distortions, projection television receivers are normally provided with an auxiliary deflection yoke for each of the three CRTs. These auxiliary deflection yokes are commonly referred to as convergence yokes. Each of the three CRTs requires a horizontal deflection coil and a vertical deflection coil in its convergence yoke, for a total of six deflection coils in a convergence yoke system.

The deflection coils of the convergence yokes are necessarily excited with current waveforms which are appropriate for correcting the video image that is present on the projection screen. Such waveforms are often generated as combinations of vertical-rate and horizontal-rate parabolas, ramps and DC levels, and as the product of such parabolas, ramps and DC levels.

Each of the six convergence yoke coils is driven by a separate power amplifier because the amplitudes and shapes of the current waveforms needed to excite the six deflection coils may be different from one another. Each of the power amplifiers takes as an input voltage a low-voltage waveform generated by a convergence waveform generator and produces as an output to the corresponding deflection coil a current, which is proportional to such voltage and is of sufficient power to drive the coil.

In a typical arrangement for a power amplifier 100, shown in FIG. 2, a conventional waveform generator 10 provides a convergence correction voltage waveform 20 to a predriver stage 30. Predriver stage 30 drives a conventional output stage 40. Output stage 40 ultimately drives deflection coil L1 with a convergence correction current $I_{CORR}$, which is proportional to convergence correction voltage waveform 20. A sense voltage $V_{SENSE}$ develops as convergence correction current $I_{CORR}$ flows through current sense resistor $R_{SENSE}$. The sense voltage $V_{SENSE}$ is fed back to the predriver stage 30. Resistor $R_Q$ controls ringing at deflection coil L1 by limiting a high-frequency gain of power amplifier 100.

It is good design practice to design power amplifier 100 such that the semiconductor devices, for example transistors, used in the amplifier are protected against damage that may be caused by thermal and electrical stresses. Furthermore, in a convergence yoke system having a plurality of deflection coils and a separate power amplifier dedicated to each deflection coil, it is especially desirable to design power amplifier 100 such that the power dissipated in each of its stages is kept to a minimum and its manufacturing cost is minimized through the use of a minimum number of parts.

SUMMARY OF THE INVENTION

In an amplifier circuit according to the inventive arrangements taught herein, a predriver stage does not conduct an appreciable common-mode current. Furthermore, the predriver stage is protected against thermally induced damage to its semiconductor devices.

Such an amplifier circuit comprises: an output stage for driving a load; first and second transistors in a push-pull configuration for driving the output stage; first and second differential amplifiers for driving the first and second transistors, respectively, the first transistor being driven during positive-polarity excursions of an input voltage waveform responsive to a feedback signal generated by the load, and the second transistor being driven during negative-polarity excursions of the input voltage waveform responsive to the feedback signal; and, means for limiting common-mode current flow between the first and second transistors.

The limiting means may ensure operation of the first and second transistors in a class B mode and may also protect the first and second transistors against damage caused by an electrical overstress condition. The limiting means may comprise: a first voltage divider defined by a first resistor coupled to an emitter electrode of the first transistor and a second resistor coupled between the emitter and collector electrodes of the first transistor; and, a second voltage divider defined by a third resistor coupled to an emitter electrode of the second transistor and a fourth resistor coupled from between emitter and collector electrodes of the second transistor.

According to a feature of the inventive arrangement taught herein, such an amplifier circuit comprises: an output stage for driving a load; first and second transistors in a push-pull configuration for driving the output stage; and, first and second thermal protection circuits operatively associated with the first and second transistors, respectively, for adjusting emitter voltages of the transistors responsive to thermally-induced increases in current conducted by the transistors.

The thermal protection circuits may comprise: a first voltage divider defined by a first resistor coupled to an emitter electrode of the first transistor and a second resistor coupled between the emitter and collector electrodes of the first transistor; and, a second voltage divider defined by a third resistor coupled to an emitter electrode of the second transistor and a fourth resistor coupled from between emitter and collector electrodes of the second transistor.

DETAILED DESCRIPTION OF THE PREFERRED EMBODIMENTS

Figure 1:
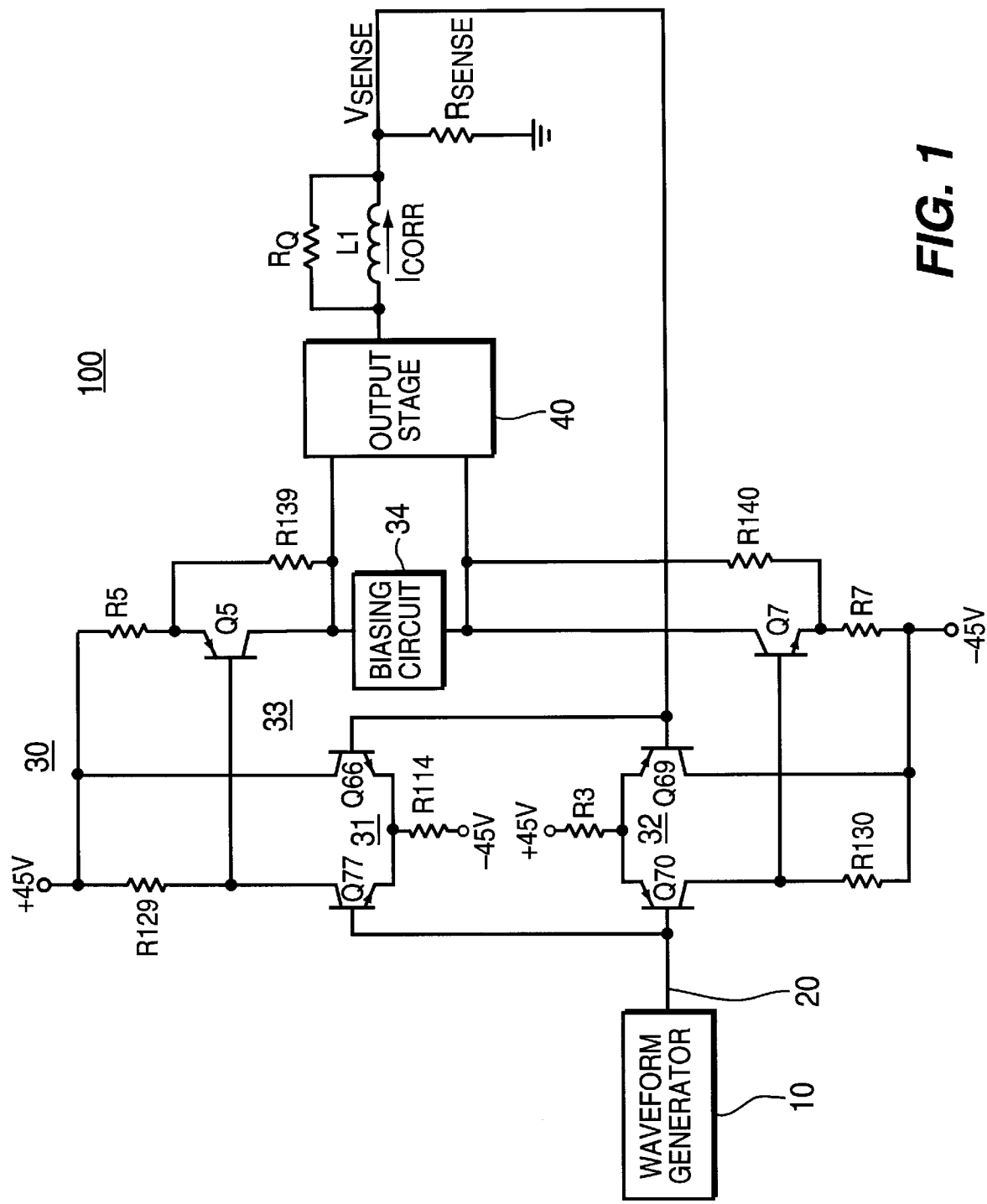
FIG. 1 is a diagram, in block and schematic form, of an amplifier circuit according to an inventive arrangement taught herein.
Figure 2:
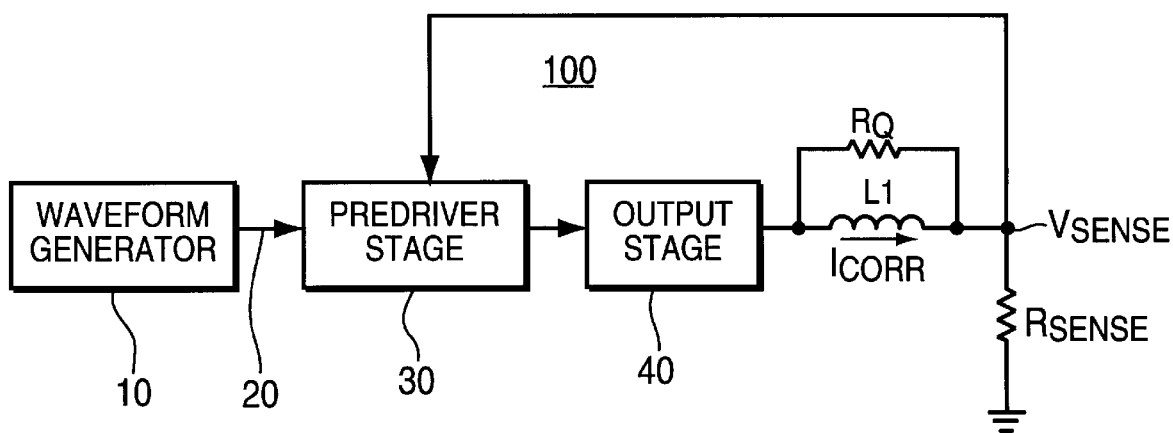
FIG. 2 is a block diagram of a prior art arrangement utilized in amplifier circuits.

A power amplifier 100, shown in FIG. 2, may comprise a predriver stage 30 which has an arrangement as shown in FIG. 1.

Referring to FIG. 1, a predriver stage 30 may generally comprise first and second differential amplifiers 31 and 32, which drive a complementary push-pull stage 33.

First differential amplifier 31 may generally comprise transistors Q66 and Q77 and resistors R114 and R129, and may be coupled to first and second sources of voltage potential, for example +45 V and −45 V. One skilled in the art may choose different values for the first and second sources of voltage potential depending upon circuit, signal and load requirements. Transistors Q66 and Q77 may, for example, have an industry part number BC546B.

Second differential amplifier 32 may generally comprise transistors Q69 and Q70 and resistors R3 and R130, and may also be coupled to the first and second sources of voltage potential. Transistors Q69 and Q70 may, for example, have an industry part number BC556B.

Complementary push-pull stage 33 may generally comprise transistors Q5 and Q7, resistors R5, R7, R139 and R140, and a biasing circuit 34. Transistors Q5 and Q7 may, for example, have industry part numbers MPSA92 and MPSA42, respectively. The biasing circuit 34 is used for determining a class of operation for output stage 40 and for minimizing crossover distortion associated with the output stage 40. The biasing circuit 34 may be of a conventional design, and is not discussed herein.

In operation, convergence correction voltage waveform 20 is coupled to the first and second differential amplifiers 31 and 32 at the base electrodes of transistors Q70 and Q77 and sense voltage $V_{SENSE}$ is coupled to the first and second differential amplifiers 31 and 32 at the base electrodes of transistors Q66 and Q69. In a balanced condition, convergence correction voltage waveform 20 has an amplitude of approximately zero volts, sense voltage $V_{SENSE}$ is equal to approximately zero volts and a current flowing through resistor R114 is divided equally between transistors Q66 and Q77. Similarly, a current flowing through resistor R3 is conducted equally by transistors Q69 and Q70.

A voltage divider formed by resistors R5 and R139 biases the emitter electrode of transistor Q5 such that a voltage between the base and emitter electrodes of transistor Q5 is slightly less than the voltage at which transistor Q5 would begin to turn on. Similarly, a voltage divider formed by resistors R7 and R140 biases the emitter electrode of transistor Q7 such that a voltage between the base and emitter electrodes of transistor Q7 is slightly less than the voltage at which transistor Q7 would begin to turn on. An insignificantly small, temperature-dependent common-mode current equal to, for example, a small percentage of 1 mA may flow from transistor Q5 to transistor Q7. A current equal to approximately 1.3 mA flows through resistors R139 and R140.

During positive-polarity excursions of convergence correction voltage waveform 20, which may, for example, reach a peak level of +2 V, the current conducted by transistor Q70 decreases as transistor Q70 becomes less conductive. Since the current flowing through resistor R3 remains constant, the current conducted by transistor Q69 increases by an amount that is equal to the decrease in current through transistor Q70. As transistor Q70 becomes less conductive, it supplies less current to the base electrode of transistor Q7, thereby turning off transistor Q7.

Concurrently, the current conducted by transistor Q77 increases as transistor Q77 tends to become more conductive. Since the current flowing through resistor R114 remains constant, the current conducted by transistor Q66 decreases by an amount that is equal to the increase in current through transistor Q77. As transistor Q77 becomes more conductive, it draws more current from the base electrode of transistor Q5, thereby turning on transistor Q5.

During negative-polarity excursions of convergence correction voltage waveform 20, which may, for example, reach a peak level of −2 V, the current conducted by transistor Q70 increases as transistor Q70 becomes more conductive. Since the current flowing through resistor R3 remains constant, the current conducted by transistor Q69 decreases by an amount that is equal to the increase in current through transistor Q70. As transistor Q70 becomes more conductive, it supplies more current to the base electrode of transistor Q7, thereby turning on transistor Q7.

Concurrently, the current conducted by transistor Q77 decreases as transistor Q77 tends to become less conductive. Since the current flowing through resistor R114 remains constant, the current conducted by transistor Q66 increases by an amount that is equal to the decrease in current through transistor Q77. As transistor Q77 becomes less conductive, it draws less current from the base electrode of transistor Q5, thereby turning off transistor Q5.

The voltage dividers formed by resistors R5 and R139 and by resistors R7 and R140 bias the emitters of transistors Q5 and Q7, respectively, so as to prevent a common-mode current from flowing through those two transistors. This has several advantageous consequences.

When first and second differential amplifiers 31 and 32 are balanced, the voltage dividers formed by resistors R5 and R139 and by resistors R7 and R140 bias the emitter electrodes of transistors Q5 and Q7, respectively, such that transistors Q5 and Q7 remain on the threshold of turning on, and only an insignificantly small, temperature-dependent common-mode current flows from transistor Q5 to transistor Q7. This is advantageous because it reduces the power dissipated within the predriver stage 30 and thereby increases the overall efficiency of power amplifier 100.

The voltage dividers provided by resistors R5 and R139 and by resistors R7 and R140 also enhance the tendency of push-pull stage 33 to operate in a class B mode. During positive-polarity excursions of convergence correction voltage waveform 20, transistor Q5 conducts and transistor Q7 does not conduct. As a result, the voltages at the collector electrodes of transistors Q5 and Q7 are both equal to approximately +45 V, and a current equal to approximately 2.6 mA flows through resistors R7 and R140. The voltage at the emitter electrode of transistor Q7 thus only changes over a range equal to approximately 180 mV as its collector voltage swings through the range defined by the first and second sources of voltage potential.

Similarly, during negative-polarity excursions of convergence correction voltage waveform 20, transistor Q7 conducts and transistor Q5 does not conduct. As a result, the voltages at the collector electrodes of transistors Q5 and Q7 are both equal to approximately −45 V and, thus, a current equal to approximately 2.6 mA flows through resistors R5 and R139. The voltage at the emitter electrode of transistor Q5 thus only changes over a range equal to approximately 180 mV as its collector voltage swings through the range defined by the first and second sources of voltage potential.

The presence of the voltage dividers defined by resistors R5 and R139 and by resistors R7 and R140 also protects transistors Q5 and Q7 from the potentially destructive effects of electrical stresses caused by, for example, an overcurrent condition. If transistor Q7 fails and becomes a short circuit, transistor Q5 is protected because the voltage divider formed by resistors R5 and R139 constrains the voltage at the emitter electrode of transistor Q5 to change by only approximately 180 mV, as described above. If, on the other hand, transistor Q5 fails and becomes a short circuit, transistor Q7 is protected because the voltage divider formed by resistors R7 and R140 constrains the voltage at the emitter electrode of transistor Q7 to change by only approximately 180 mV.

Finally, the voltage divider arrangements provided by resistors R5 and R139 and by resistors R7 and R140 provide the additional advantage of protecting transistors Q5 and Q7 from thermally-induced damage. As is well-known in the art, the base-emitter voltage of a bipolar junction transistor has a negative temperature coefficient. Thus, as the temperature of the transistor increases, the base-emitter voltage of the transistor decreases and, consequently, the current conducted by the transistor increases. Of course, as current is conducted by the transistor, the transistor dissipates power in the form of heat, which increases the temperature of the transistor. This increase in temperature causes an increase in current, which, in turn, causes a further increase in temperature. This process, referred to in the art as thermal runaway, eventually destroys the transistor.

In a presently preferred embodiment of predriver stage 30, as the temperature of transistor Q5, for example, begins to increase, transistor Q5 begins to saturate and it conducts a larger current. Before this mechanism can lead to thermal runaway, however, the voltage divider defined by resistors R5 and R139 biases the emitter electrode of transistor Q5 to a lower voltage. As a result, the voltage between the emitter and base electrodes of transistor Q5 decreases and, consequently, the current conducted by transistor Q5 is reduced.

A similar result obtains for transistor Q7. As the temperature of transistor Q7, for example, begins to increase, transistor Q7 begins to saturate and it conducts a larger current. Before this mechanism can lead to thermal runaway, however, the voltage divider defined by resistors R7 and R140 biases the emitter electrode of transistor Q7 to a higher voltage. As a result, the voltage between the base and emitter electrodes of transistor Q7 decreases and, consequently, the current conducted by transistor Q7 is reduced.

Having described a presently preferred embodiment of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. An amplifier circuit, comprising:
    an output stage for driving a load;
    first and second transistors in a push-pull configuration for driving said output stage;
    first and second differential amplifiers for driving said first and second transistors, respectively, said first transistor being driven during positive-polarity excursions of an input voltage waveform responsive to a feedback signal generated by said load, and said second transistor being driven during negative-polarity excursions of said input voltage waveform responsive to said feedback signal; and,
    means for limiting common-mode current flow between said first and second transistors.

2. The amplifier circuit of claim 1, wherein said limiting means ensures operation of said first and second transistors in a class B mode.

3. The amplifier circuit of claim 1, wherein said limiting means protects said first and second transistors against damage caused by an electrical overstress condition.

4. The amplifier circuit of claim 1, wherein said load comprises a deflection coil of a television receiver.

5. An amplifier circuit, comprising:
    an output stage for driving a load;
    first and second transistors in a push-pull configuration for driving said output stage;
    first and second differential amplifiers for driving said first and second transistors, respectively, said first transistor being driven during positive-polarity excursions of an input voltage waveform responsive to a feedback signal generated by said load, and said second transistor being driven during negative-polarity excursions of said input voltage waveform responsive to said feedback signal; and,
    means for limiting common-mode current flow between said first and second transistors;
    wherein said limiting means comprises:
        a first voltage divider defined by a first resistor coupled to an emitter electrode of said first transistor and a second resistor coupled between said emitter and collector electrodes of said first transistor; and,
        a second voltage divider defined by a third resistor coupled to an emitter electrode of said second transistor and a fourth resistor coupled from between emitter and collector electrodes of said second transistor.

6. An amplifier circuit, comprising:
    an output stage for driving a load;
    first and second transistors in a push-pull configuration for driving said output stage; and,
    first and second thermal protection circuits operatively associated with said first and second transistors, respectively, for adjusting emitter voltages of said transistors responsive to thermally-induced increases in current conducted by said transistors.

7. An amplifier circuit, comprising:
    an output stage for driving a deflection coil of a television receiver;
    first and second transistors in a push-pull configuration for driving said output stage; and,
    first and second thermal protection circuits operatively associated with said first and second transistors, respectively, for adjusting emitter voltages of said transistors responsive to thermally-induced increases in current conducted by said transistors.

8. The amplifier circuit of claim 6, wherein said thermal protection circuits comprise:
    a first voltage divider defined by a first resistor coupled to an emitter electrode of said first transistor and a second resistor coupled between said emitter and collector electrodes of said first transistor; and,
    a second voltage divider defined by a third resistor coupled to an emitter electrode of said second transistor and a fourth resistor coupled from between emitter and collector electrodes of said second transistor.

9. An amplifier circuit for a television receiver, said amplifier circuit comprising:
    an output stage for driving a deflection coil;
    first and second transistors in a push-pull configuration for driving said output stage;
    first and second differential amplifiers for driving said first and second transistors, respectively, said first transistor being driven during positive-polarity excursions of an input voltage waveform responsive to a feedback signal generated by said deflection coil, and said second transistor being driven during negative-polarity excursions of said input voltage waveform responsive to said feedback signal; and, means for limiting common-mode current flow between said first and second transistors.

10. The amplifier circuit of claim 9, wherein said limiting means ensures operation of said first and second transistors in a class B mode.

11. The amplifier circuit of claim 9, wherein said limiting means protects said first and second transistors against damage caused by an electrical overstress condition.

12. An amplifier circuit for a television receiver, said amplifier circuit comprising:

an output stage for driving a deflection coil;

first and second transistors in a push-pull configuration for driving said output stage;

first and second differential amplifiers for driving said first and second transistors, respectively, said first transistor being driven during positive-polarity excursions of an input voltage waveform responsive to a feedback signal generated by said deflection coil, and said second transistor being driven during negative-polarity excursions of said input voltage waveform responsive to said feedback signal; and, means for limiting common-mode current flow between said first and second transistors, wherein said limiting means comprises:

a first voltage divider defined by a first resistor coupled to an emitter electrode of said first transistor and a second resistor coupled between said emitter and collector electrodes of said first transistor; and, a second voltage divider defined by a third resistor coupled to an emitter electrode of said second transistor and a fourth resistor coupled from between emitter and collector electrodes of said second transistor.

13. An amplifier circuit for a television receiver, said circuit comprising:

an output stage for driving a deflection coil;

first and second transistors in a push-pull configuration for driving said output stage; and, first and second thermal protection circuits operatively associated with said first and second transistors, respectively, for adjusting emitter voltages of said transistors responsive to thermally-induced increases in current conducted by said transistors.

14. An amplifier circuit for a television receiver, said circuit comprising:

an output stage for driving a deflection coil;

first and second transistors in a push- pull configuration for driving said output stage; and, first and second thermal protection circuits operatively associated with said first and second transistors, respectively, for adjusting emitter voltages of said transistors responsive to thermally-induced increases in current conducted by said transistors, wherein said thermal protection circuits comprise:

a first voltage divider defined by a first resistor coupled to an emitter electrode of said first transistor and a second resistor coupled between said emitter and collector electrodes of said first transistor; and, a second voltage divider defined by a third resistor coupled to an emitter electrode of said second transistor and a fourth resistor coupled from between emitter and collector electrodes of said second transistor.

\* \* \* \* \*